US008216368B2

(12) United States Patent
Faure et al.

(10) Patent No.: US 8,216,368 B2
(45) Date of Patent: Jul. 10, 2012

(54) METHOD OF FABRICATING AN EPITAXIALLY GROWN LAYER

(75) Inventors: Bruce Faure, Grenoble (FR); Fabrice Letertre, Grenoble (FR)

(73) Assignee: Soitec, Bernin (FR)

( * ) Notice: Subject to any disclaimer, the term of this patent is extended or adjusted under 35 U.S.C. 154(b) by 210 days.

(21) Appl. No.: 12/553,221

(22) Filed: Sep. 3, 2009

(65) Prior Publication Data

US 2009/0321884 A1 Dec. 31, 2009

Related U.S. Application Data

(60) Division of application No. 11/283,706, filed on Nov. 22, 2005, now Pat. No. 7,601,217, which is a continuation-in-part of application No. PCT/EP2004/007578, filed on Jul. 7, 2004.

(30) Foreign Application Priority Data

Jul. 24, 2003 (FR) ...................................... 03 09079

(51) Int. Cl.
*C30B 25/18* (2006.01)
(52) U.S. Cl. .......... 117/103; 117/92; 117/104; 117/106; 117/108; 438/459; 438/528; 438/503
(58) Field of Classification Search ................ 117/54, 117/92, 103, 104, 106, 108; 438/459, 528, 438/928, 977, 503, 497
See application file for complete search history.

(56) References Cited

U.S. PATENT DOCUMENTS

| | | | | |
|---|---|---|---|---|
| 4,561,915 A | * | 12/1985 | Mito | 438/32 |
| 4,601,779 A | * | 7/1986 | Abernathey et al. | 438/459 |
| 5,013,681 A | | 5/1991 | Godbey et al. | 438/459 |
| 5,024,723 A | | 6/1991 | Goesele et al. | 438/459 |
| 5,147,808 A | | 9/1992 | Pronko | 438/459 |
| 5,213,986 A | | 5/1993 | Pinker et al. | 438/459 |
| 5,229,305 A | | 7/1993 | Baker | 438/459 |
| 5,244,817 A | | 9/1993 | Hawkins et al. | 438/64 |
| 5,270,246 A | * | 12/1993 | Mannou et al. | 438/43 |
| 5,310,451 A | | 5/1994 | Tejwani et al. | 438/459 |
| 5,324,678 A | | 6/1994 | Kusunoki | 438/459 |
| 5,374,564 A | * | 12/1994 | Bruel | 438/455 |
| 5,439,843 A | | 8/1995 | Sakaguchi et al. | 438/459 |
| 5,476,813 A | * | 12/1995 | Naruse | 438/311 |
| 5,714,395 A | * | 2/1998 | Bruel | 438/528 |
| 5,856,229 A | | 1/1999 | Sakaguchi et al. | 438/406 |

(Continued)

FOREIGN PATENT DOCUMENTS

EP 1 288 346 A2 3/2003

(Continued)

OTHER PUBLICATIONS

Balkas et al., "Growth and characterization of GaN single crystals," Journal of Crystal Growth, 208: 100-106 (2000).

(Continued)

*Primary Examiner* — Bob M Kunemund
(74) *Attorney, Agent, or Firm* — Winston & Strawn LLP

(57) ABSTRACT

A method of forming an epitaxially grown layer, preferably by providing a region of weakness in a support substrate and transferring a nucleation portion to the support substrate by bonding. A remainder portion of the support substrate is detached at the region of weakness and an epitaxial layer is grown on the nucleation portion. The remainder portion is separated or otherwise removed from the support portion.

20 Claims, 5 Drawing Sheets

U.S. PATENT DOCUMENTS

| | | | |
|---|---|---|---|
| 5,966,620 A | 10/1999 | Sakaguchi et al. | 438/455 |
| 6,121,112 A | 9/2000 | Sakaguchi et al. | 438/406 |
| 6,143,628 A | 11/2000 | Sato et al. | 438/455 |
| 6,146,457 A * | 11/2000 | Solomon | 117/90 |
| 6,150,239 A * | 11/2000 | Goesele et al. | 438/458 |
| 6,191,007 B1 | 2/2001 | Matsui et al. | 438/459 |
| 6,284,629 B1 | 9/2001 | Yokokawa et al. | 438/459 |
| 6,303,405 B1 * | 10/2001 | Yoshida et al. | 438/46 |
| 6,303,468 B1 | 10/2001 | Aspar et al. | 438/455 |
| 6,309,945 B1 | 10/2001 | Sato et al. | 438/409 |
| 6,323,108 B1 | 11/2001 | Kub et al. | 438/458 |
| 6,323,110 B2 | 11/2001 | Ling | 438/459 |
| 6,335,263 B1 * | 1/2002 | Cheung et al. | 438/455 |
| 6,391,799 B1 | 5/2002 | Di Cioccio | 438/781 |
| 6,486,008 B1 | 11/2002 | Lee | 438/149 |
| 6,540,827 B1 * | 4/2003 | Levy et al. | 117/3 |
| 6,653,209 B1 | 11/2003 | Yamagata | 438/459 |
| 6,677,249 B2 * | 1/2004 | Laermer et al. | 438/745 |
| 6,736,894 B2 * | 5/2004 | Kawahara et al. | 117/2 |
| 6,794,276 B2 * | 9/2004 | Letertre et al. | 438/506 |
| 6,819,693 B2 * | 11/2004 | Kinoshita et al. | 372/43.01 |
| 6,855,619 B2 * | 2/2005 | Iwasaki et al. | 438/475 |
| 6,867,067 B2 * | 3/2005 | Ghyselen et al. | 438/107 |
| 6,964,914 B2 | 11/2005 | Ghyselen et al. | 438/458 |
| 6,974,759 B2 | 12/2005 | Moriceau et al. | 438/459 |
| 6,991,995 B2 | 1/2006 | Aulnette et al. | 438/458 |
| 7,001,826 B2 | 2/2006 | Akatsu et al. | 438/458 |
| 7,008,859 B2 | 3/2006 | Letertre et al. | 438/459 |
| 7,008,860 B2 | 3/2006 | Kakizaki et al. | 438/459 |
| 7,018,909 B2 | 3/2006 | Ghyselen et al. | 438/455 |
| 7,195,987 B2 | 3/2007 | Bae et al. | 438/406 |
| 7,205,211 B2 * | 4/2007 | Aspar et al. | 438/458 |
| 7,208,392 B1 | 4/2007 | Jaussaud et al. | 438/455 |
| 7,226,509 B2 * | 6/2007 | Faure | 117/95 |
| 7,229,898 B2 * | 6/2007 | Bourdelle et al. | 438/455 |
| 7,232,737 B2 | 6/2007 | Daval | 438/455 |
| 7,235,462 B2 * | 6/2007 | Letertre et al. | 438/455 |
| 7,261,777 B2 * | 8/2007 | Faure | 117/89 |
| 7,300,853 B2 | 11/2007 | Joly et al. | 438/406 |
| 2004/0067622 A1 | 4/2004 | Akatsu et al. | 438/459 |
| 2004/0077166 A1 | 4/2004 | Nagal et al. | 438/689 |
| 2004/0082146 A1 * | 4/2004 | Ohmi et al. | 438/455 |
| 2004/0109486 A1 * | 6/2004 | Kinoshita et al. | 372/45 |
| 2005/0009288 A1 | 1/2005 | Cheng et al. | 438/407 |
| 2005/0081958 A1 | 4/2005 | Adachi et al. | 148/33.1 |
| 2005/0245049 A1 | 11/2005 | Akatsu et al. | 438/458 |
| 2006/0063356 A1 | 3/2006 | Park et al. | 438/459 |
| 2006/0076559 A1 * | 4/2006 | Faure et al. | 257/49 |
| 2006/0079071 A1 | 4/2006 | Moriceau et al. | 438/459 |
| 2006/0118513 A1 * | 6/2006 | Faure et al. | 216/33 |
| 2006/0194415 A1 | 8/2006 | Lee et al. | 438/459 |
| 2007/0117350 A1 | 5/2007 | Seacrist et al. | 438/459 |
| 2007/0184632 A1 | 8/2007 | Yamazaki et al. | 438/459 |
| 2008/0087881 A1 * | 4/2008 | Ueda et al. | 257/40 |

FOREIGN PATENT DOCUMENTS

| | | |
|---|---|---|
| JP | 2002175985 | 6/2002 |
| JP | 2002241191 | 8/2002 |
| WO | WO 02/43112 A2 | 5/2002 |
| WO | WO 02/43124 A2 | 5/2002 |
| WO | WO 2005/014895 A1 | 2/2005 |

OTHER PUBLICATIONS

Kelly et al., "Large Free-Standing GaN Substrates by Hydride Vapor Phase Epitaxy and Laser-Induced Liftoff," Jpn. J. Appl. Phys., 38: L217-L219 (1999).

Melnik et al., "Physical Properties of Bulk GaN Crystals Grown by HVPE," MRS, vol. 2, Article 39 (1997).

Morgan et al., "Evaluation of GaN growth improvement techniques," Materials Science and Engineering, B90: 201-205 (2002).

Porowski, "Bulk and homoepitaxial GaN-growth and characterisation," Journal of Crystal Growth, 189/190: 153-158 (1998).

Tong et al., "Semiconductor Wafer Bonding: Science and Technology," John Wiley & Sons, Inc., publishers, pp. 1-15, 80-99 (1999).

* cited by examiner

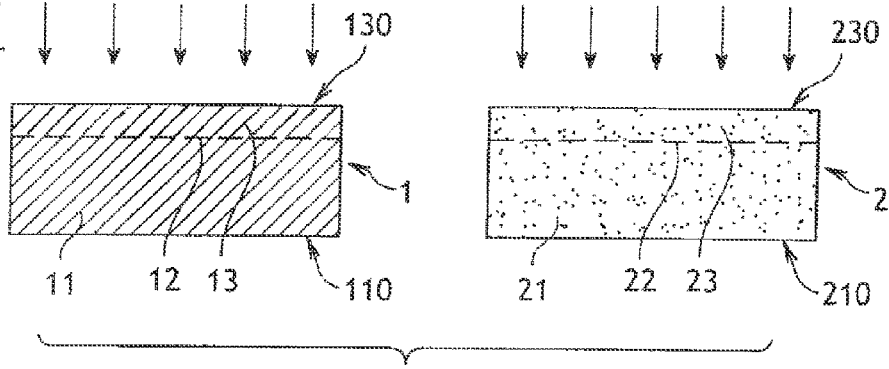
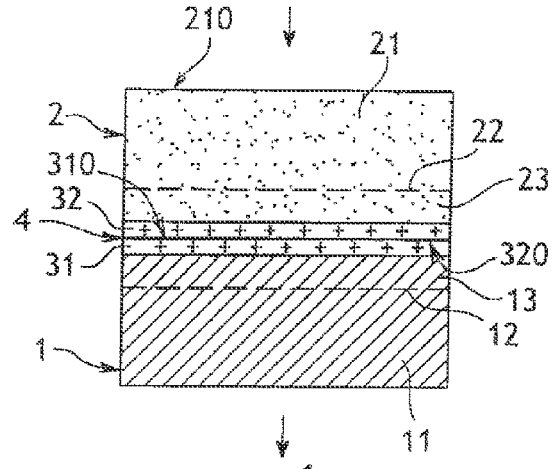
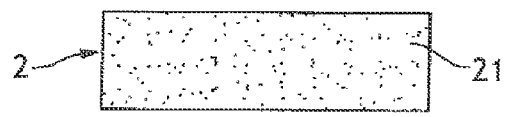
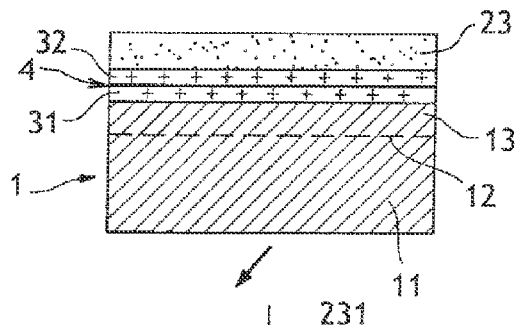
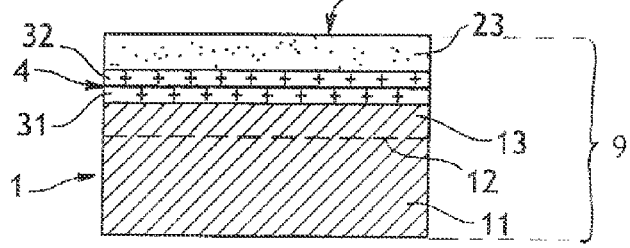

FIG.8
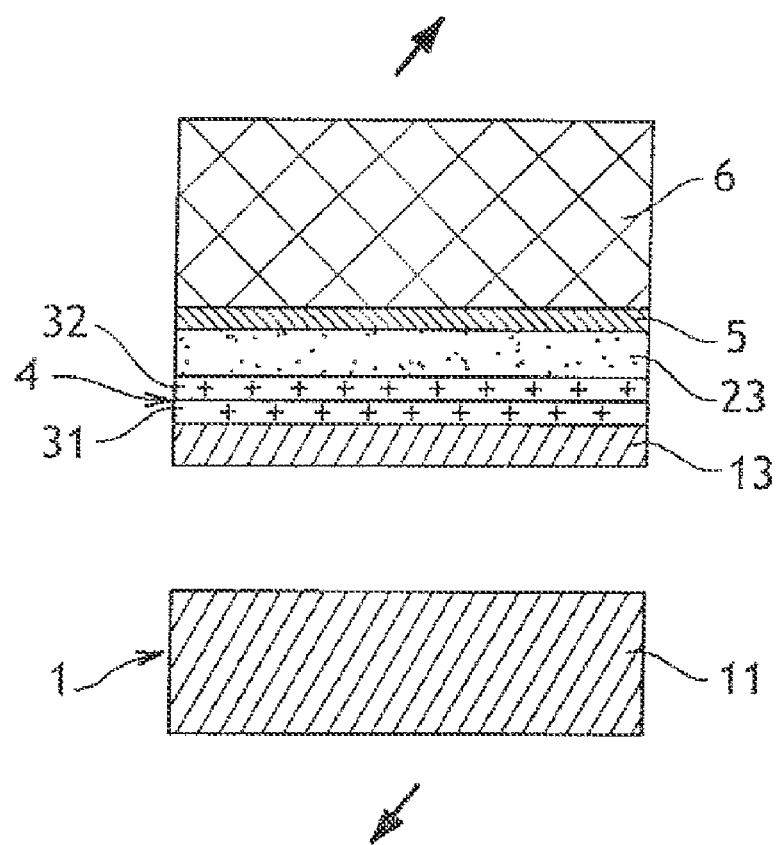
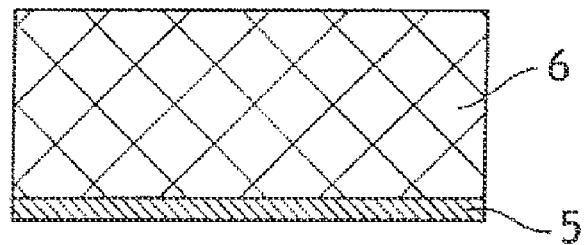
FIG.9

METHOD OF FABRICATING AN EPITAXIALLY GROWN LAYER

CROSS-REFERENCE TO RELATED APPLICATIONS

This application is a division of application Ser. No. 11/283,706 filed Nov. 22, 2005 now U.S. Pat. No. 7,601,217, which is a continuation-in-part of PCT Patent Application No. PCT/EP04/07578 filed Jul. 7, 2004, the entire content of each of which is hereby incorporated herein by reference thereto.

FIELD OF THE INVENTION

The present invention relates to a method of fabricating an epitaxially grown layer, such as for applications in the fields of optics, optoelectronics, or electronics.

BACKGROUND OF THE INVENTION

Certain materials, for example silicon, having properties that are particularly interesting in the fields mentioned above, can be obtained in large quantities and with excellent quality using ingot pulling techniques that are well known to the skilled person.

The ingots obtained are then readily sliced into wafers which, after a large number of processing steps, become substrates that are used to produce integrated circuits, for example.

Other materials such as gallium arsenide, gallium nitride, indium phosphide, germanium, or silicon carbide, are also of interest. However, not all of those materials can be obtained by pulling ingots of high crystalline quality. Further, it is not always possible to fabricate substrates from such ingots because the costs are too high or the method is too difficult to implement. Thus, for example, existing methods are not suitable for fabricating gallium nitride (GaN) ingots on an industrial scale.

The document "Bulk and homoepitaxial GaN growth and characterization", Porowski-S, Journal of Crystal Growth, vol 189-190, June 1998, pp. 153-158, describes a method of growing a monocrystalline GaN ingot in the liquid phase at a pressure of 12 to 20 kbars (12 to $20\times10^8$ Pascals (Pa)) and at a temperature in the range 1400° C. to 1700° C. However, those conditions are difficult to implement under mass production conditions. Further, they can only produce crystals with a maximum diameter of 18 millimeters (mm).

Other research teams have also worked on a method of growing an ingot in the liquid phase at reduced pressure (less than 2 bars ($2\times10^5$ Pa)) and at a temperature of 1000° C. The diameter of the crystals obtained is larger, close to 50 mm, but the crystalline quality obtained is not as good as with the above-mentioned technique.

Finally, the document "Growth and characterization of GaN single crystals", Balka et al, Journal of Crystal Growth, vol 208, January 2000, p 100-106, discloses the growth of monocrystalline GaN by sublimation. The fabrication conditions employed are a pressure of less than 1 bar ($10^5$ Pa) and a temperature of 1000° C. to 1200° C. The crystalline quality obtained is very high, but the crystal size is 3 mm, which is clearly insufficient for the envisaged applications. Thus, the market currently offers no monocrystalline gallium nitride in the bulk form, of high quality, of a sufficient diameter, and at a reasonable price.

The prior art discloses a number of attempts to fabricate substrates by epitaxy or heteroepitaxy in order to overcome the problem of obtaining certain specific materials.

Epitaxy can combine materials with different natures in the form of thin films and combine their properties to produce components, for example high electron mobility transistors (HEMTs), diodes, or lasers.

Heteroepitaxy involves depositing the desired material onto a support of different crystallographic nature by epitaxy, and then eliminating the support, if possible and necessary for the remainder of the process. The main drawback of that technique is that the material constituting the support and that deposited by epitaxy generally have different lattice parameters and thermal expansion coefficients.

The differences in lattice parameters between the support and the epitaxial layer create a large number of crystalline defects in the epitaxially grown material, such as dislocations or stacking defects, for example.

Added to that is the fact that epitaxial growth is generally carried out at high temperatures, above 600° C. and possibly up to 1000° C. to 100° C., for example, when growing gallium nitride epitaxially by metal organic chemical vapor deposition (MOCVD). For that reason, as the structure which is formed cools to ambient temperature, the epitaxial layer obtained develops a number of residual stresses and strains connected with differences in thermal expansion between it and its support.

To overcome that drawback, the material selected as the support preferably has crystalline structure and thermal expansion coefficient very close to those of the materials which are to be grown epitaxially. As an example, gallium and indium arsenide or gallium and aluminum arsenide can be grown epitaxially on a gallium arsenide support with crystallographic quality that is sufficient to produce components.

However, other materials do not always have a compatible support that is in the form of a substrate. This is particularly the case with materials such as gallium nitride or cubic silicon carbide.

Until now, components having one of those two materials as the active layer have been grown by heteroepitaxy.

Thus, for gallium nitride, light-emitting diodes (LEDs) and lasers emitting in the blue, violet and ultraviolet as well as high frequency power components have been produced using sapphire, hexagonal silicon carbide, or silicon as the support.

For silicon carbide, which is unavailable in the form of a substrate in its cubic crystalline structure, micro electromechanical components (MEMS) or power transistors have been produced by depositing silicon carbide onto a silicon substrate by epitaxy.

However, in order to further improve the quality of the components obtained, it would be desirable to fabricate bulk gallium nitride or cubic silicon carbide substrates of the same nature as the epitaxially grown layer deposited over it.

Attempts made in the past have resulted in products with a certain number of disadvantages. As an example, one intermediate route consists in using a technique termed "high growth rate epitaxy" to produce an epitaxially grown film that is as thick as the substrate supporting it. That support substrate is then eliminated and only the thick epitaxially grown film is retained, which in turn becomes a substrate for conventional epitaxy. Methods of that type exist for producing gallium nitride and silicon carbide, but the quality of the substrates obtained is generally mediocre because of the influence of the original support substrate of different crystallographic nature.

Thus, typically, large residual stresses are observed in the case of the epitaxial growth of cubic silicon carbide on silicon. Such stresses generally result in very substantial curvature of the epitaxially grown silicon carbide once the original silicon support substrate has been removed. That curvature renders it unusable for all subsequent forming steps.

Similarly, for the gallium nitride obtained, the influence of the support substrate is illustrated by the appearance of a very large number of dislocations and by cracking of the epitaxially grown film as its temperature falls, in particular when that epitaxially grown film exceeds a certain critical thickness.

U.S. Pat. No. 6,146,457 describes a further method that makes use of the stresses that appear as the temperature falls following epitaxy as the driving force for detaching an original support substrate from a thick epitaxially grown layer. That result is obtained by inserting a layer termed a "weak" layer between the support substrate and the thick epitaxially grown layer such that when the system stresses increase, the weak layer ruptures and thus ensures controlled detachment of the support from the thick epitaxial layer. However, that detachment technique is difficult to control with a large specimen. Further, it involves inserting a particular layer as epitaxial growth commences or during epitaxial growth, which may be deleterious to the crystallographic quality of that epitaxially grown layer.

Further, the document "Physical properties of bulk GaN crystals grown by HVPE", Melnik et al, MRS Internet Journal of Nitride Semiconductor Research, vol 2, art 39, describes a method of growing gallium nitride (GaN) monocrystals by HVPE on a monocrystalline silicon carbide (SiC) substrate, and removing that substrate using a reactive ionic etching (RIE) technique. However, that SiC substrate takes a long time to remove since it is highly inert chemically.

Finally, the document "Large free-standing GaN substrates by hydride vapor phase epitaxy and laser induced lift-off", Kelly et al, Jpn J Appl Phys, vol 38, 1999, describes a method of growing GaN by hydride vapor phase epitaxy (HVPE) on a sapphire substrate, then removing that substrate by laser-induced lift-off. That technique is based on using a laser of a wavelength that is absorbed only by gallium nitride and not by sapphire. Scanning the resulting structure with the laser ensures that the two materials become detached by local modification of the properties of the GaN after passage of the laser.

This lift-off technique, however, is difficult to implement when treating large areas, since laser beam scanning takes a long time.

It is also possible to remove the sapphire substrate by mechanical polishing, but that method is also lengthy and furthermore, it runs the risk of breaking the gallium nitride layer when lifting off the substrate, by releasing the existing stresses.

Thus, there is a need for improved methods of making an epitaxially grown layer of high crystallographic quality that can be readily detached from its epitaxial support, especially for materials that have previously only been obtainable by heteroepitaxy. The present invention now satisfies this need.

SUMMARY OF THE INVENTION

The present invention relates to forming an epitaxially grown layer on a wafer that is configured to facilitate this growth. In a preferred embodiment of this method, a support substrate is provided that includes a support portion and a support substrate remainder portion. This is preferably done by providing a region of weakness within the support substrate, which divides the support substrate into and defines the support portion and a support substrate remainder portion. The support and support substrate remainder portions are disposed on opposite sides of the regional weakness. The support portion can include a support free-surface. A nucleation portion is transferred onto the support substrate remainder portion support by bonding. The nucleation portion is selected and configured to improve conditions for growing an epitaxial layer of the desired material compared to growing such a layer on the support substrate. An epitaxial layer is grown on the nucleation portion, and the support substrate remainder portion is removed, preferably by detaching the remainder portion from the support portion at the region of weakness and is separating it from the support portion.

Preferably, the remainder portion is maintained in contact with, and more preferably engaged against, the detached support portion during the growing of the epitaxial layer. This contact or engagement can help support and stabilize the composite wafer that is thus formed, during the growth of the epitaxial layer. Sufficient strength is provided by these engaged portions to effect the support and stabilization, such as by providing a sufficient thickness to the support substrate.

In the preferred embodiment, the nucleation portion is transferred by providing a region of weakness within a nucleation substrate to divide the nucleation substrate into and define the nucleation portion and a nucleation substrate remainder portion, which are disposed on opposite sides of the region of weakness therein. The nucleation portion preferably comprises a nucleation free-surface, and is bonded to the support substrate, such as to the free-surface thereof, to provide a composite wafer that comprises the bonded nucleation and support substrates. The nucleation substrate remainder portion is preferably then detached at the nucleation substrate region of weakness. In an alternative embodiment, the nucleation portion can be transferred to the support substrate by bonding a nucleation substrate onto the support substrate and reducing the thickness of the bonded nucleation substrate until reaching the nucleation portion, preferably so that only the nucleation portion thereof remains on the support substrate.

One or both of the regions of weakness can be provided by implanting atomic species within the respective substrate. The nucleation substrate remainder portion can be detached by applying a first energy budget to the composite wafer, with the support substrate remainder portion being detached by applying a second energy budget that is greater than the first energy budget. The second energy budget is preferably greater than the cumulative energy budget supplied preceding the detachment of the support substrate remainder portion, and most preferably is greater than the cumulative energy budget for any other detachments that have been made. Preferably, these energy budgets are thermal budgets, and the energy provided comprises heat.

A bond enhancing layer can be provided to the support substrate and/or the nucleation substrate. The bond enhancing layer is selected to improve the bonding and conditions for bonding between the support and nucleation substrates, such that at least one of the free surfaces is on the bond enhancing layer(s). A preferred bond enhancing layer is made of a dielectric material.

A further nucleation layer can be provided on the nucleation portion to further improve the conditions for growing the epitaxial layer but are on compared to the conditions that would exist in the nucleation portion. Preferably, the support and nucleation portions are removed from the epitaxial layer once this is grown. The epitaxial layer itself is of a wide band gap semi conductor material in the preferred embodiment, such as gallium nitride or cubic silicon carbide. Also, the epitaxial layer can be grown to a thickness in which it is self-supporting, meaning that it does not require the support of another layer to keep from breaking at least when handled, although a lesser thickness can alternatively be provided if the epitaxial layer is intended to be supported by another layer. Preferred materials for making the support substrate include silicon, sapphire, polycrystalline silicon carbide, 6H or 4H monocrystalline silicon carbide, gallium nitride, aluminum nitride, and zinc oxide. Preferred materials for the nucleation layer include gallium nitride, silicon, silicon carbide, sapphire, diamond, gallium arsenide, and aluminum nitride.

Additionally, a first layer of metal can be applied onto the epitaxial layer, and a second layer of metal can be applied onto an acceptor substrate can be used, for example, to support the epitaxial layer after it is detached from the other portions of the composite wafer. The layers of metal are preferably bonded to each other prior to separating the support substrate remainder portion from the support portion. Although the epitaxial layer can be grown by heteroepitaxy, the preferred epitaxial layer is grown substantially by homoepitaxy. The preferred surface area of the layer grown covers an area having a diameter of at least about 20 mm, and more preferably at least about 30 or 40 mm.

A preferred multilayer substrate for producing a layer with an epitaxial layer includes a support substrate with a first region of weakness formed therein. The first regional weakness divides the support substrate into a support portion and a support substrate remainder portion that are disposed on opposite sides of the first region of weakness. The first region of weakness is configured to facilitate detachment of the support portion from the support substrate remainder portion, and the support portion is configured for providing support during subsequent epitaxial growth of an epitaxial layer. The nucleation substrate is bonded to the support substrate and includes a second region of weakness disposed therein. The second region of weakness divides the nucleation substrate into a nucleation portion and a nucleation substrate remainder portion that are disposed on opposite sides of the second region of weakness. The second region of weakness is configured to facilitate detachment of the nucleation portion from the nucleation substrate remainder portion. The nucleation and support portions are preferably disposed between the first and second regions of weakness, with the nucleation portion being configured to improve conditions for growing an epitaxial layer compared to the conditions extant on the support substrate.

Consequently, the invention provides an improved method of growing an epitaxial layer of materials that were previously difficult to obtain epitaxially with high quality and large diameter or surface area.

BRIEF DESCRIPTION OF THE DRAWINGS

Other characteristics and advantages of the invention become apparent from the following description made with reference to the accompanying drawings which provide non-limiting indications of possible implementations.

FIGS. 1 to 9 are diagrammatic views of successive steps of a first embodiment of a method according to the invention.

Figure 5:
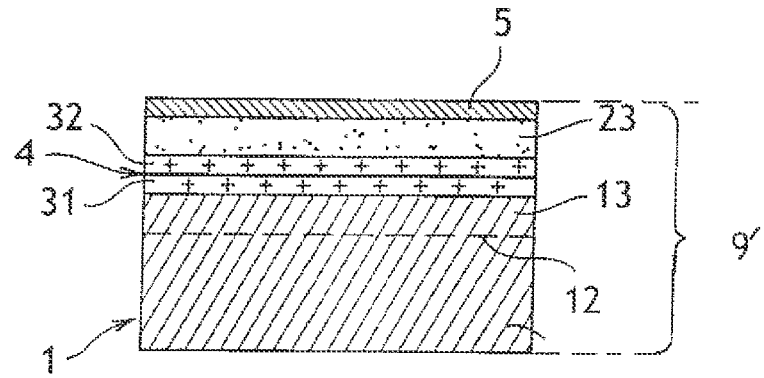

It should be noted that for simplification, the different layers shown in the figures are not drawn to scale particularly as regards their relative thicknesses.

DETAILED DESCRIPTION OF THE PREFERRED EMBODIMENTS

The present invention provides a method of fabricating an epitaxially grown layer of excellent crystallographic quality that can readily be detached from its epitaxy support. The invention is applicable to materials which have previously been obtainable only by heteroepitaxy, in particular wide band gap materials. The invention also provides an epitaxy support substrate and a method for its fabrication, and provides a method of fabricating an epitaxially grown layer in particular for applications in the fields of optics, optoelectronics, or electronics.

The preferred method comprises the following steps:

(a) implanting atomic species within a first substrate termed the "support substrate" to define therein a zone of weakness which demarcates a thin layer termed the "thin support layer" from the remainder of said substrate;

(b) transferring onto the free surface of said thin support layer a thin nucleation layer of a nature which is suitable for subsequent epitaxial growth of said epitaxially grown layer, by implementing a bonding interface between the two;

(c) detaching the remainder of the support substrate along the corresponding zone of weakness, but while maintaining the thin support layer in contact with said remainder;

(d) growing said epitaxially grown layer by epitaxy on said nucleation layer; and (e) moving away the remainder of the support substrate from the thin support layer.

The method enables the nucleation layer to be detached from its support before the start of epitaxial growth of the desired material, and thus enables the influence of the support substrate during subsequent epitaxial growth to be minimized.

In addition, that method overcomes the problem of eliminating the support substrate; such a step can be difficult to implement, as mentioned above in the analysis of the prior art. As an example, eliminating hard materials such as sapphire or silicon carbide is lengthy and difficult using conventional lapping or chemical or ionic etching techniques.

The method of the invention also presents the following advantageous and non-limiting characteristics, taken in isolation or in combination:

According to a first embodiment of the invention, step (b) of transferring the thin nucleation layer is carried out:

by implanting atomic species within a second substrate termed the "nucleation substrate" to define therein a zone of weakness which demarcates said thin nucleation layer from the remainder of said substrate, then by bonding the two substrates one against the other, so that their respective thin support and nucleation layers are located facing each other, and by detaching the remainder of the nucleation substrate along the corresponding zone of weakness, the parameters for the two implantations being selected so that when combined with the nature of the pair of materials constituting said support substrate and said nucleation substrate, the energy budget to be supplied for subsequently carrying out detachment of the remainder along the zone of weakness is greater than the cumulative energy budget supplied during all of the steps preceding said detachment.

Advantageously, the parameters for the two implantations are selected so that, when combined with the nature of the materials forming the support substrate and the nucleation substrate, the thermal budget to be supplied for subsequently carrying out detachment of the remainder along the zone of weakness is greater than the cumulative thermal budget supplied during all of the steps preceding said detachment, and the detachment steps are carried out by heating.

Advantageously, the remainder of the nucleation substrate or the remainder of the support substrate can be detached by application of additional energy of mechanical, optical, and/or chemical origin.

According to a second embodiment of the invention, step (b) of transferring the thin nucleation layer is carried out:
- by bonding a second substrate, termed the "nucleation substrate" onto said thin support layer,
- by reducing the thickness of said substrate from its back face by lapping and/or chemical etching and/or ionic etching to obtain said thin nucleation layer.

Preferably, bonding the two thin support and nucleation layers is carried out by means of at least one layer of intermediate bonding material, made for example of dielectric material, such as silicon oxide, silicon nitride, and silicon oxynitrides.

The bonding of the two thin support and nucleation layers either directly one against the other or in the presence of at least one layer of intermediate bonding material can be carried out by molecular bonding.

Before step (d), the epitaxially grown layer can be epitaxially grown to form a fine nucleation layer on said thin nucleation layer. The fine nucleation layer can be produced by metal organic chemical vapor deposition (MOCVD), by hydride vapor phase epitaxy (VHPE), by molecular beam epitaxy (MBE), by cathode sputtering deposition, by epitaxial lateral over growth (ELOG), or pendeo-epitaxy, for example.

Advantageously, the preferred method comprises the additional step of eliminating the thin support layer, the thin nucleation layer, and optionally the layer or layers of dielectric material remaining integral with the epitaxially grown layer.

The epitaxially grown layer can be produced from a wide band-gap semiconductor material. Any wide band-gap material having a band-gap value above 1.5 eV can be used. Specifically preferred wide band-gap materials include gallium nitride (GaN); aluminum nitride (AlN); or silicon carbide (SiC). Also, the epitaxially grown layer can be of sufficient thickness to constitute a self-supported layer.

In one embodiment of the invention, the thickness of the epitaxially grown layer obtained at the end of step (d) is insufficient to be self-supporting, and the method comprises the following additional steps carried out between steps (d) and (e):
- applying a first layer of metal onto the thin epitaxial layer, and a second layer of metal onto a third substrate termed the "acceptor substrate",
- placing the two layers of metal in contact with each other and bonding them together,
- to obtain the thin epitaxial layer transferred onto the acceptor substrate at the end of step (e).

The invention also provides a method of fabricating an epitaxy support substrate to be used for the fabrication of an epitaxially grown layer for applications in the fields of optics or optoelectronics.

Another embodiment of an inventive method comprises the following steps:
(i) implanting atomic species within a first substrate termed the "support substrate" to define therein a zone of weakness which demarcates a thin layer termed the "thin support layer" from the remainder of said substrate and along which said thin film and said remainder are detachable;
(ii) transferring onto the free surface of said thin support layer a thin nucleation layer of a nature which is suitable for subsequent epitaxial growth of said epitaxially grown layer, by implementing a bonding interface between the two, in order to obtain said epitaxy support substrate.

Advantageously, step (ii) of transferring the thin nucleation layer can be carried out as above mentioned for step (b) of the method of fabricating an epitaxially grown layer. Preferably, the bonding of the two thin support and nucleation layers is carried out as described above.

The invention also provides an epitaxy support substrate intended to be used for the fabrication of an epitaxially grown layer in particular for above mentioned applications. This substrate comprises:
- a first substrate termed "support substrate" comprising a zone of weakness which demarcates a thin layer termed the "thin support layer" from the remainder of said substrate, and
- a thin nucleation layer selected and configured for subsequent epitaxial growth of the epitaxially grown layer, the nucleation layer being bonded to said support film either directly or with at least one layer of intermediate bonding material, such as a dielectric material.

The preferred method uses a first substrate 1 termed the "support substrate" and a second substrate 2 termed the "nucleation substrate". The support substrate 1 has a face 130 termed the "front face," which is intended to come into contact subsequently with the nucleation substrate 2, and an opposite face 110 termed the "back face". Similarly, the nucleation substrate 2 has a front face 230 and an opposite back face 210.

The material of the support substrate 1 is selected to have good mechanical strength, preferably even at high temperatures, which may reach 1300° C. to 1400° C. Preferably, currently commercially available bulk substrates are used. Suitable materials for the support substrate 1 include silicon, sapphire, polycrystalline silicon carbide, 6H or 4H monocrystalline silicon carbide, gallium nitride (GaN), aluminum nitride (AlN), and zinc oxide (ZnO).

The nucleation substrate 2 is preferably selected so that its nature and its lattice parameters allow subsequent epitaxial growth of the future layer 6 or 6' (see FIGS. 7-9 and 10-14) of epitaxially grown material that is to be obtained. As an example, the nucleation substrate 2 can be a semiconductor material, such as gallium nitride (GaN), silicon (Si), silicon carbide (SiC), sapphire, diamond, gallium arsenide (AsGa), or aluminum nitride (AlN).

When an epitaxially grown layer of gallium nitride is to be formed, the nucleation substrate 2 is preferably selected from (111) silicon, silicon carbide (SiC), sapphire, or gallium nitride (GaN), and when the epitaxial layer is formed from cubic silicon carbide, the nucleation substrate 2 is preferably (001) silicon Si, or silicon carbide. The two substrates 1 and 2 can be of identical or different natures.

An operation for implanting atomic species in the support substrate 1 and in the nucleation substrate 2 is carried out, preferably with the implantation occurring through the respective front faces 130 and 230.

The term "atomic species implantation" means any bombardment of atomic species, including molecular and ionic species, which can introduce the species into a material, with a maximum concentration of the species being located at a depth that is determined with respect to the bombarded surface, which in this case are the surfaces 130 or 230. The molecular or ionic atomic species are introduced into the material with an energy that is also distributed about a maximum.

Atomic species implantation can be carried out, for example, using an ion beam implanter or a plasma immersion implanter. Preferably, the implantation is carried out by ionic bombardment. Preferably, the implanted atomic species are hydrogen ions. Other ionic species can advantageously be used alone or in combination with hydrogen, such as rare gases (for example helium).

Reference should be made in this regard to the literature concerning Soitec's Smart-Cut® method.

The implantation creates a zone of weakness 12 in the bulk of the source substrate 1 at a mean implantation depth. The zone of weakness divides the substrate 1 into two portions, preferably a thin support portion or layer 13, and the remainder 11 of said substrate. The thin layer 13 extends between the zone of weakness 12 and its front face 130.

In similar manner, following implantation, the nucleation substrate 2 has a zone of weakness 22, which divides a thin nucleation portion or layer 23, and a remainder 21.

Optionally, a layer of protective material can be formed on the front layer 130 of the substrate 1 and/or on the front face 230 of the substrate 2. When such protective layers are present, atomic species implantation can be carried out through them, such as by implantation through their respective free upper faces. The protective layers may be sacrificial layers that act as masks and thus protect the substrates 1 and 2 during implantation. They can thus be eliminated after the implantation.

The parameters for the two atomic species implantations, i.e., the dose and the implantation energy, are selected as a function of criteria given below.

As shown in FIG. 2, the support substrate 1 is bonded onto the nucleation substrate 2 such that their respective thin layers 13 and 23 are located facing each other.

Preferably, bonding is carried out by molecular bonding. Such bonding techniques are known to the skilled person and have been described, for example, in the work by Gösele, "Semiconductor wafer bonding", Sciences and Technology, Q. Y. Tong, U. Gösele, Wiley Interscience publications.

The bonding interface between the front face 130 of the support substrate 1 and the front face 230 of the support substrate 2 carries reference numeral 4. It is also possible, however, to carry out bonding between the thin layers 13 and 23 by providing at least one intermediate bonding layer formed on the front layer 130 of the substrate 1 and/or on the front face 230 of the substrate 2. These layers can, for example, be the above-mentioned protective layers or bond enhancing layers 31 and 32. The bonding interface 4 is then the interface between the upper face 310 of the layer of material 31 and the upper face 320 of the layer of material 32.

As an example, the bond enhancing layers 31 and 32 can be formed from amorphous or polycrystalline silicon or from alumina ($Al_2O_3$). Preferably, said bond enhancing layers 31 and 32 are layers of dielectric material selected, such as silicon oxide ($SiO_2$), silicon nitride ($Si_3N_4$), or silicon oxynitrides ($Si_xO_yN$). They may be identical in nature or different, and they have thickness in the range from a few tens of nanometers to about 1 micrometer (1 μm).

Bond enhancing layers 31 and 32 can, for example, be obtained by plasma enhanced chemical vapor deposition (PECVD), or by oxidation of the substrate, such as when formed from silicon or monocrystalline silicon carbide.

The two contacting surfaces are bonded after suitable surface preparation, for example and as is well known to the skilled person, by cleaning in known SC1 or SC2 type chemicals, by chemico-mechanical polishing, or by plasma or ultraviolet-ozone activation of one or both contacting surfaces. Ultraviolet-ozone activation is exposure to ultraviolet radiation in a gas environment so that the ultraviolet radiation interacts with the environment and generates ozone, which then activates the surface. These various methods can also be combined. The abbreviation "SC" corresponds to "standard clean". Cleaning product SC1 is based on liquid ammonia, hydrogen peroxide, and water, and SC2 is based on hydrochloric acid, hydrogen peroxide, and water.

Bonding can also be reinforced by thermal annealing. This annealing is adapted so that it has no influence on the zones of weakness 12 and 22 and does not cause detachment along those zones at this stage.

The provision of thermal annealing is preferable to obtain strong bonding at the bonding interface 4 and to provide a stiffening effect that maintains the growth of defects formed at the zones of weakness 12 and 22 in a plane parallel to that of said bonding interface 4.

The remainder 21 of the nucleation substrate 2 shown in FIG. 3 can then be detached by supplying energy of mechanical, thermal, optical, and/or chemical origin.

In this regard, it should be noted that the two above-mentioned atomic species implantation steps are carried out with dose and implantation energy parameters selected such that, considering the nature of the pair of materials constituting the support substrate 1 and the nucleation substrate 2, the energy budget to be supplied to carry out the subsequent detachment of the remainder 11 along the zone of weakness 12 is greater than the cumulative energy budget supplied during all of the steps preceding detachment. Preferably, the parameters are selected so that the thermal budget to be supplied during detachment of the remainder 11 along the zone of weakness 12 is greater than the cumulative thermal budget supplied during all of the steps preceding said detachment and the steps for detaching the remainder 11 and the remainder 21 are carried out by heating.

Further, it should be noted that the strength of the bonding interface 4 is sufficient to tolerate said two detachments without debonding.

Thermal energy can be supplied by applying a suitable thermal budget, for example by heating the stack of layers shown in FIG. 2 for a given time. Mechanical energy can be supplied, for example, by exerting bending and/or tensile stresses on the remainder 21 of the nucleation substrate 2, or by introducing a blade or a jet of fluid (liquid or gas), for example, at the zone of weakness 22. Shear or ultrasound forces may additionally or alternatively be applied.

Mechanical stresses can also result from supplying energy of electrical origin, such as by the application of an electrostatic or electromagnetic field. The stresses can also originate from thermal energy derived, for example, from applying an electromagnetic field, an electron beam, thermoelectric heating, a cryogenic fluid, or a supercooled liquid. They can also be of optical origin, such as by applying a laser beam to the zone of weakness, light absorption by the material then providing sufficient energy to generate detachment along the zone of weakness.

Detachment energy of chemical origin may be supplied, for example, by etching in a chemical product.

Advantageously, and as shown in FIG. 4, it is possible to improve the surface quality of the free surface 231 of the layer 23 to limit or reduce its residual roughness observed after the step for detaching the remainder 21. This can be helpful in ensuring the success of the subsequent steps of the method, in particular deposition of a layer by epitaxial growth. The roughness of surface 23, can be achieved by different methods such as chemical mechanical polishing, thermal oxidation followed by deoxidation (in hydrofluoric acid, for example), plasma etching, or ion beam or ion cluster smoothing.

In one embodiment the nucleation layer 23 is silicon, and cubic silicon carbide is to be deposited thereon by epitaxy. In this embodiment, it is also possible to prepare the free surface 231 using the method described in U.S. Pat. No. 6,736,894.

The thin layers 13 and 23 are preferably of the order of 10 nanometers (10 nm) to about 10 micrometers (10 μm) thick, and more preferably are in the range from a few tens of nanometers, such as from about 20 or 30 nm to 1.5 μm, and thus are preferably too thin to be self-supporting. In advantageous manner, one of the two thin layers 13 and 23 is substantially thicker than the other, such as five to twenty times thicker, to substantially eliminate or reduce residual stresses within the stack of layers shown in FIG. 4, so that the free surface 231 is as flat as possible. Said stack of layers constitutes an epitaxy support substrate 9.

In FIG. 5, a fine nucleation layer 5 is formed on the thin nucleation layer 23 by epitaxy to obtain an epitaxy support substrate 9'. This step is performed in the preferred embodiment, but is not performed in an alternative embodiment. The two above-mentioned epitaxy support substrates 9 and 9' are advantageous in that the implantation is made in substrate 1 before the transfer of the nucleation layer 23 portion, so that the thin support layer 13 may be made thicker, with a thickness similar to that achievable if support layer 13 had been provided, after the transfer of the nucleation layer 23 portion.

Layer 5 can be produced from the same material as that subsequently used to produce the epitaxially grown layer. It then can serve as a seed for homoepitaxy, which improves the crystallographic quality of this layer.

The fine layer 5 can also be used to compensate for differences in the expansion coefficients and lattice parameters existing between the nucleation layer 23 and the layer 6, which will subsequently be grown by epitaxy. In one embodiment, the fine layer 5 has a thickness that is preferably in the range from about 200 nm to 100 μm. As an example, a fine layer 5, or GaN, can be grown epitaxially by metal organic chemical vapor deposition (MOCVD) or by molecular beam epitaxy (MBE). The fine nucleation layer 5 can alternatively be obtained by hydride vapor phase epitaxy (HVPE), or by cathode sputtering deposition.

It is also possible to use epitaxial lateral over-growth techniques, known as "ELOG," or a technique known as "pendeoepitaxy," in which motifs are etched into the thin nucleation layer 23 before depositing the fine layer 5. Reference should be made to the article by Morgan et al, "Evaluation of GaN growth improvement techniques," Materials Science and Engineering B90 (2002), 201-205, for a description of these techniques. This list of suitable techniques is not exhaustive.

The material used to produce the fine nucleation layer 5 can also be different from that used for the nucleation layer 23 and for the future epitaxially grown layer 6.

Figure 6:
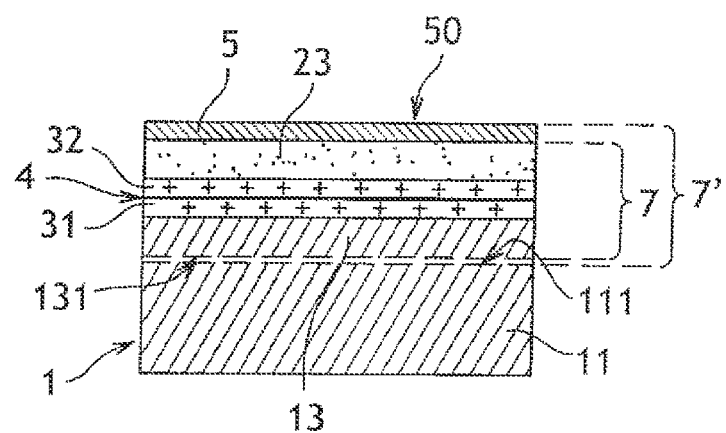

Whether or not the fine nucleation layer 5 has been deposited, energy is supplied to the stack of layers that is sufficient to cause detachment of the remainder portion 11 along the zone of weakness 12, as shown in FIG. 6.

When nucleation layer 5 is used, energy supplied is greater than the cumulative energy budget applied during detachment at the zone of weakness 22 and during epitaxy of the fine nucleation layer 5. When a nucleation layer 5 is not used, it is sufficient for the energy supplied to be greater than that supplied to carry out detachment along the zone of weakness 22 of the nucleation substrate. The detachment of the remainder 11 is preferably carried out using the techniques described above for detachment along the zone of weakness 22.

Detachment isolates multilayered structure 7' from the remainder 11 of the support substrate 1. The multilayered structure 7' comprises the thin support layer 13, the thin nucleation layer 23, the fine nucleation layer 5 and, if present, the molecular bond enhancing layers 31 and 32. In embodiments in which the fine nucleation layer 5 is not present, the multilayered structure is shown with reference numeral 7, as can be seen in FIG. 6.

Detachment is preferably carried without separating the remainder 11 of the support substrate 1 from the structure 7 or 7' and in particular from the support layer 13. In other words, the thin support layer 13 stays in contact with the remainder 11. The two layers 11 and 13 remain engaged, however, because their facing surfaces, respectively 111 and 131, are very rough, which ensures sufficient friction to maintain the whole structure in place. Further, the multilayered structures 7 or 7' and the remainder 11 of the support substrate 1 can be kept against each other, for example, by a clip or other device. In a further variant, the stack of layers 7 or 7' and 11 can also be placed in an epitaxial reactor, and detachment is then carried out, with a susceptor or support of the reactor maintaining the thin layer 13 and the remainder 11 in contact with each other as explained above. To this end, the susceptor can comprise a clip or a cavity with a shape that is substantially the same or complimentary with the substrate, for example.

The structure 7 is preferably several hundred nanometers, such as 200-300 nm to about a few tens of microns thick, such as 20-50 μm; structure 7' is preferably about 200 nm to 100 μm thick; the fine nucleation layer 5 is preferably two to ten times thicker than the structure 7. This range of thicknesses is selective so that the multilayered structures 7 or 7' are mechanically stable during the subsequent step in which epitaxy is repeated in FIG. 7.

Figure 7:
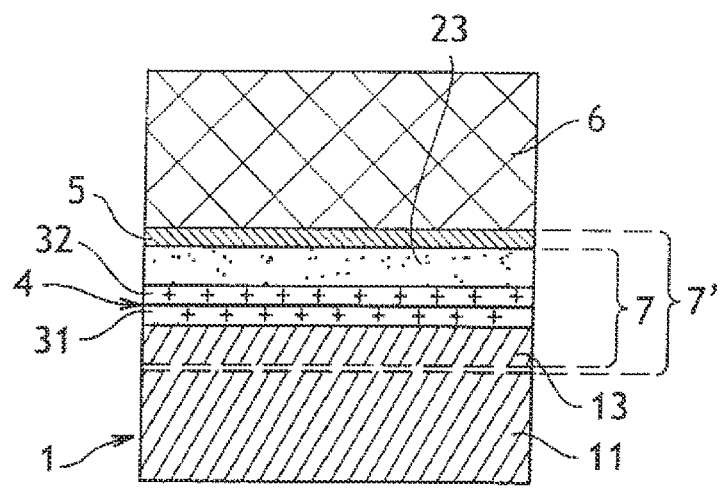

As shown in FIG. 7, the material intended to form the future epitaxially grown layer 6 to be obtained is deposited, either on the free surface 231 of the nucleation layer 23 or on the upper free face 50 of the fine nucleation layer 5, if present. The epitaxially grown layer 6 can be of any material that can be deposited by epitaxy, preferably large band gap semiconductor materials, most preferably gallium nitride or cubic silicon carbide.

In one embodiment, deposition is continued until the layer 6 reaches a thickness of at least 100 μm, whereupon it is self-supporting and constitutes a substrate which can in turn, for example, be used as a substrate for epitaxy.

The epitaxially grown layer 6 is preferably obtained by a high growth rate epitaxial growth technique. In the case of gallium nitride, a particularly suitable method is hydride vapor phase epitaxy (HVPE). Deposition is carried out at a temperature in the range 700° C. to 1100° C. In the case of cubic silicon carbide, a particularly suitable method is chemical vapor deposition (CVD) carried out in a cold wall CVD reactor.

Since the layer 6 is substantially thicker than the multilayered structures 7 or 7' by a factor of about 10 to 100, it can be considered that the influence of said multilayered structures on the epitaxially grown layer 6 is very small. This produces a very high quality layer of hetero- or homo-epitaxially grown material 6 since the support problems mentioned above in the analysis of the prior art are avoided.

Further, the fine nucleation layer 5 is generally two to ten times thicker than the structure 7 on which it rests. As a result, the global structure 7' can be considered to have the same properties as the material of the fine nucleation layer 5, which is advantageous for epitaxial growth of the material 6.

As shown in FIG. 8, the remainder 11 of the support substrate 1 is moved away from the thin support layer 13. Finally, as shown in FIG. 9, the multilayered structures 7 or 7' are eliminated from the epitaxially grown layer 6, for example by chemical etching, reactive ion etching (RIE) or chemico-mechanical polishing or a combination of said techniques. This results in the epitaxially grown layer 6 alone or with the fine nucleation layer 5.

In this embodiment, the nucleation layer 23 was obtained by forming a zone of weakness in the nucleation substrate 2. However, in another embodiment, the thin nucleation layer 23 can be obtained in a different manner, such as by bonding a substrate 2 which does not have a zone of weakness onto the support substrate 1 with or without a dielectric layer 31 and 32, and then by attacking the back face 210 of said substrate 2. Such attack can be carried out either by chemical etching alone or by grinding followed by chemical attack and/or ionic etching. That method is known to the skilled person as BESOI which stands for "bond and etch back silicon on insulator".

Figure 10:
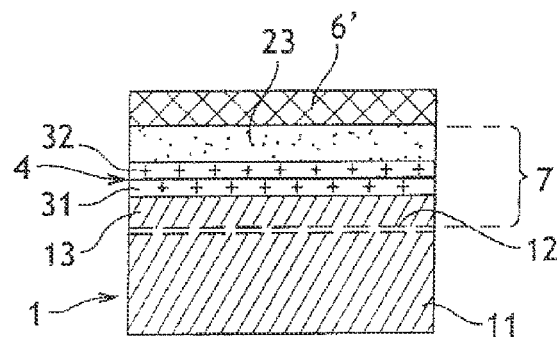
FIGS. 10 to 14 are diagrammatic views of successive steps of a second embodiment of a method according to the invention.

Another embodiment of the method is described below with reference to FIGS. 10-14. The first steps of this embodiment are identical to those shown in FIGS. 1-4. Energy is supplied to the stack of layers shown in FIG. 4 in sufficient quantity to cause detachment of the remainder 11 from the support substrate 1 along the zone of weakness 12, as shown in FIG. 10. This detachment is carried out using the techniques and energy conditions described in connection with the step shown in FIG. 6. The detachment is therefore carried out taking care not to move the remainder 11 away from the support substrate 1 of the multilayered structure 7 which rests thereon.

A layer of material 6' is then deposited by epitaxy, but its thickness is less than about 100 μm so that it is not self-supporting.

Figure 11:
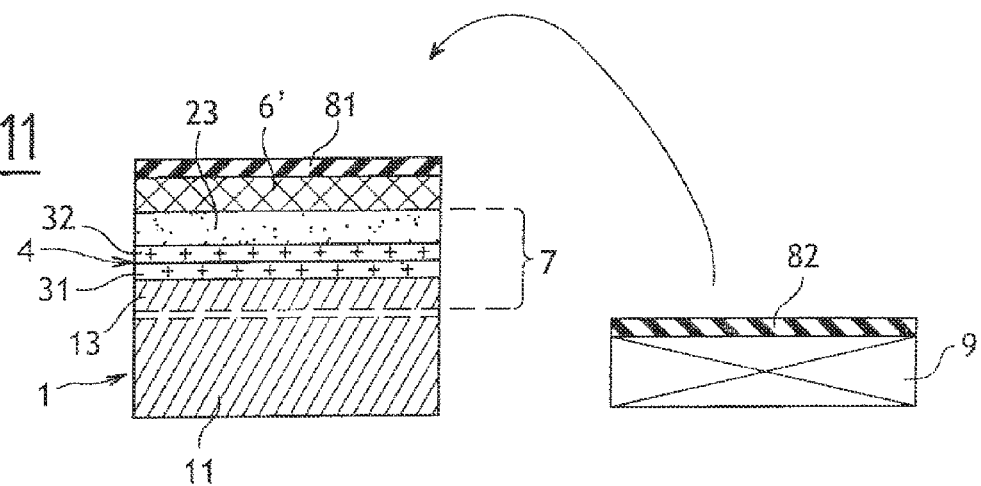
Figure 12:
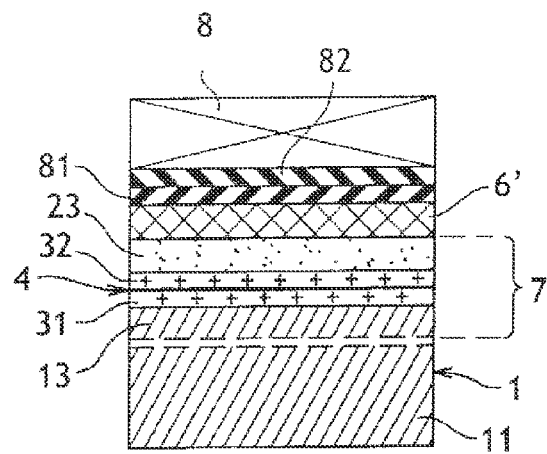

Deposition of the epitaxially grown thin layer 6' can be carried out by one of the techniques described above or by metal organic chemical vapor deposition (MOCVD) or by molecular beam epitaxy (MBE). The thin layer 6' can constitute the active portion of a component, in which case it is then transferred to a third substrate or acceptor substrate, which then becomes the mechanical support for the final component. One example of a technique for transferring the epitaxially grown thin layer 6' is shown in FIG. 11. This technique is the metal bonding technique. Reference should be made, for example, to U.S. Pat. No. 6,335,263 for a description of this technique. This technique involves depositing a first layer of metal 81 on the thin epitaxially grown layer 6' and a second layer of metal 82 onto an acceptor substrate 8.

The metal layers 81 and 82 can also be replaced by multiple superimposed layers of metals and/or metal alloys. The metals are selected to obtain good bonding and/or good electrical conduction and/or to reflect light.

Figure 13:
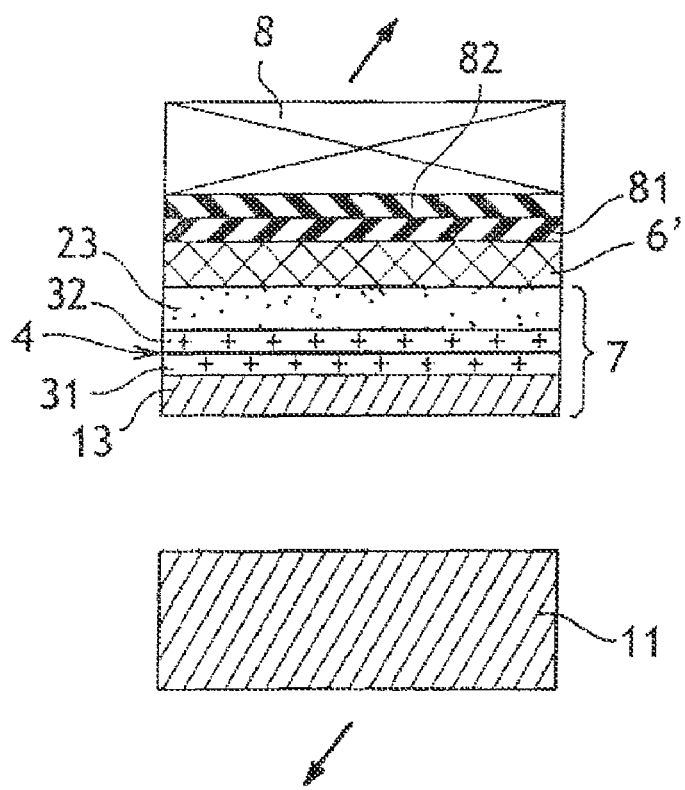
Figure 14:
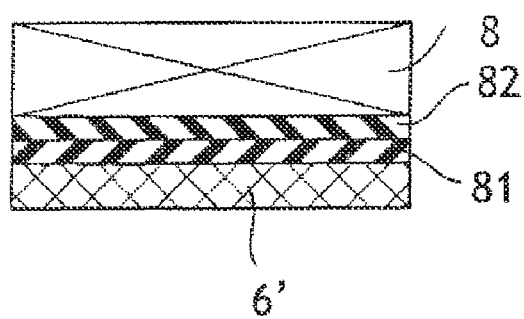

The metal layers 81 and 82 are then placed in contact with each other as shown in FIG. 11 and the interface formed is bonded by treatment at a suitable temperature and pressure. The remainder 11 is then moved away from the support substrate 1 of the thin support layer 13, as shown in FIG. 13. Finally, as shown in FIG. 14, material from the multilayered structure 7 is removed until the epitaxially grown layer 6' is obtained on the acceptor substrate 8 and is capable of constituting a conducting structure.

In another embodiment not shown in FIGS. 10-14, it is also possible to deposit the thin epitaxially grown layer 6' on a fine nucleation layer 5 deposited on the thin nucleation layer 23 using the procedures described above for the implementation of the thick epitaxially-grown layer 6.

By means of the method of the invention, the nucleation layer 23 of the support 1 is detached before carrying out epitaxial growth of the thick layer 6 or of the thin layer 6'. A "pseudo-substrate" is thus created formed by the multilayered structure 7,7', which thus enables an epitaxially grown layer to be made without being subjected to the influence of the support substrate 1, and therefore without the drawbacks of the prior art. In other words, the layer 6 is rigorously flat, does not present cracks, has an excellent crystalline quality, and its thickness is not limited.

Examples of the method of the invention are given below.

EXAMPLE 1

Production of a Thick Epitaxially Grown Gallium Nitride Layer

Hydrogen was implanted into a [111] silicon nucleation substrate 2 through a silicon oxide layer 32 obtained by thermal oxidation.

Hydrogen was also implanted onto a support substrate 1 formed from polycrystalline silicon carbide (SiC) through a layer of silicon oxide 31 obtained by deposition.

The implantation conditions for the silicon nucleation substrate 2 were an energy of 120 kilo electron-volts (keV) and a dose of $5 \times 10^{16} H^+/cm^2$, and for the SiC support substrate 1, the energy was 95 keV and the dose was $6 \times 10^{16} H^+/cm^2$.

The silicon oxide layers 31 and 32 underwent chemico-mechanical polishing, CMP, to activate them and encourage their bonding by molecular bonding.

The remainder 21 of the [111] silicon layer was then detached by annealing at a temperature of 500° C. for two hours. It should be noted that the thermal budget applied to ensure detachment in the silicon was less than that necessary to cause detachment in the silicon carbide so that detachment could not occur along the zone of weakness 12.

The structure obtained was then placed in a HVPE reactor and the remainder 11 of the support substrate was detached, but without moving away from the other portion of the stack of layers, just before a thick layer 6 of gallium nitride (GaN) was deposited. The detachment was carried out by annealing at a temperature of 1000° C. for 30 minutes.

The thickness of the GaN layer measured several hundred microns.

The remainder 11 was then moved away, and the multilayered structure 7 was eliminated by chemical etching.

The resulting thick layer of GaN was of very good crystallographic quality.

EXAMPLE 2

Production of a Thick Epitaxially Grown Layer of Monocrystalline Cubic Silicon Carbide Hydrogen was implanted into a monocrystalline [001] silicon nucleation substrate 2 through a silicon oxide layer 32 obtained by thermal oxidation.

Hydrogen was also implanted onto a support substrate 1 formed from polycrystalline silicon carbide (SiC) through a layer of silicon oxide 31 obtained by deposition.

The implantation conditions for the silicon nucleation substrate 2 were an energy of 120 keV and a dose of $5 \times 10^{16} H^+/cm^2$, and for the SiC support substrate 1, the energy was 95 keV and the dose was $6 \times 10^{16} H^+/cm^2$.

The silicon oxide layers 31 and 32 underwent chemico-mechanical polishing (CMP) to activate them and to boost bonding by molecular bonding.

The remainder 21 from the [001] silicon layer was then detached by annealing at a temperature of 500° C. for two hours. It should be noted that the thermal budget applied to ensure detachment in the silicon was less than that necessary to cause detachment in the silicon carbide, so that detachment did not occur along the zone of weakness 12.

The upper surface 231 of the [001] silicon was then prepared by chemico-mechanical polishing and by sacrificial oxidation type heat treatment.

The structure obtained was then placed in a cold wall CVD reactor and a thick layer of cubic silicon carbide was grown epitaxially.

The remainder 11 of the SiC support substrate was detached, but without moving away from the other portion of the stack of layers, just before a thick layer 6 of cubic silicon carbide (SiC) was deposited. Said detachment was carried out by annealing at a temperature of 1000° C. for 30 minutes.

The thickness of the SiC layer measured several hundred microns.

The remainder 11 was then moved away, and the multilayered structure 7 was eliminated by chemical etching.

The resulting thick layer of SiC was of very good crystallographic quality and had very little deformation or "bend" since there was no residual stress in the thick silicon carbide layer.

While it is apparent that the illustrative embodiments of the invention herein disclosed fulfill the objectives stated above, it will be appreciated that numerous modifications and other embodiments may be devised by those skilled in the art. For example, one or both of the regions of weakness can be provided by providing porous regions by a method known in the art. Therefore, it will be understood that the appended claims are intended to cover all such modifications and embodiments which come within the spirit and scope of the present invention.

What is claimed is:

1. A multilayer substrate for producing a wafer with an epitaxial layer of improved quality, the substrate comprising:
    a support substrate;
    a first region of weakness within the support substrate for dividing the support substrate into a support portion and a support remainder portion that are disposed on opposite sides of the first region of weakness, and being configured for facilitating detachment of the support portion from the support remainder portion, wherein the support portion is configured for providing support during epitaxial growth of an epitaxial layer;
    a nucleation portion that forms part of a nucleation substrate that is bonded to the support portion to improve conditions for growing the epitaxial layer thereon; and
    a second region of weakness disposed within the nucleation substrate for dividing the nucleation substrate into the nucleation portion and a nucleation remainder portion that are disposed on opposite sides of the second region of weakness, and being configured for facilitating detachment of the nucleation portion from the nucleation remainder portion, wherein the nucleation and support portions are disposed between the first and second regions of weakness,
    wherein the first and second regions of weakness are such that the energy budget required to effect detachment at the first region of weakness is greater than the energy budget required to effect detachment at the second region of weakness.

2. The multilayer substrate of claim 1 wherein the first region of weakness includes implanted atomic species.

3. The multilayer substrate of claim 1 wherein the second region of weakness includes implanted atomic species.

4. The multilayer substrate of claim 1 further comprising first and second bond enhancing layers associated with the support substrate and the nucleation substrate, respectively, and bonded to each other, wherein the enhancing layers are selected to improve bonding between the support and nucleation portions.

5. The multilayer substrate of claim 4 wherein the bond enhancing layers are made of dielectric material.

6. The multilayer substrate of claim 4 wherein the bond enhancing layers are made of silicon oxide, silicon nitride, or silicon oxynitride.

7. The multilayer substrate of claim 1 wherein the support substrate comprises a material selected from silicon, sapphire, polycrystalline silicon carbide, 6H or 4H monocrystalline silicon carbide, gallium nitride, aluminum nitride, and zinc oxide.

8. The multilayer substrate of claim 1 wherein the nucleation portion is made of a material selected from gallium nitride, silicon, silicon carbide, sapphire, diamond, gallium arsenide, and aluminum nitride.

9. The multilayer substrate of claim 1 further comprising an epitaxial layer on the nucleation portion.

10. The multilayer substrate of claim 9 wherein the epitaxial layer is present at a thickness sufficient to be self-supporting.

11. The multilayer substrate of claim 9 further comprising a first layer of metal on the epitaxial layer.

12. The multilayer substrate of claim 11 further comprising a second layer of metal associated with an acceptor substrate that is bonded to the first metal layer on the epitaxial layer.

13. The multilayer substrate of claim 9 wherein the epitaxial layer comprises a wide band-gap semiconductor material.

14. The multilayer substrate of claim 9 wherein the epitaxial layer comprises gallium nitride or cubic silicon carbide.

15. The multilayer substrate of claim 1 wherein the support remainder portion and the support portion are detached at the first region of weakness but remain sufficiently engaged to cooperatively provide sufficient strength to support the epitaxial growth of the epitaxial layer on the nucleation portion.

16. The multilayer substrate of claim 1 further comprising a nucleation layer on the nucleation portion to further improve the conditions for growing the epitaxial layer thereon.

17. The multilayer substrate of claim 16 wherein the nucleation layer comprises gallium nitride, silicon, silicon carbide, sapphire, diamond, gallium arsenide, and aluminum nitride.

18. The multilayer substrate of claim 16 further comprising an epitaxial layer on the nucleation layer, wherein the epitaxial layer is made of the same material as that of the nucleation portion or the nucleation layer.

19. A multilayer substrate for producing a wafer with an epitaxial layer of improved quality, the substrate comprising:
    a support remainder portion of a support substrate;
    a thin support portion of the support substrate which is resting on and frictionally engaged with the support remainder portion, the thin support portion having been detached from the support remainder portion at a first region of weakness within the support substrate;
    a thin nucleation portion of a nucleation substrate that is bonded to the support portion, the thin nucleation portion having been detached from the nucleation substrate at a second region of weakness within the nucleation substrate; and
    an epitaxial layer grown on the thin nucleation portion.

20. The multilayer structure of claim 19 further comprising a device for keeping the support remainder portion against the thin support portion and the thin nucleation portion.

* * * * *